United States Patent [19]

Sackman et al.

[11] Patent Number: 5,063,303

[45] Date of Patent: Nov. 5, 1991

[54] SOFT START CIRCUIT

[75] Inventors: Edward J. Sackman; Donald L. Wray, both of Sunrise, Fla.

[73] Assignee: Racal Data Communications Inc., Sunrise, Fla.

[21] Appl. No.: 652,850

[22] Filed: Feb. 8, 1991

[51] Int. Cl.[5] .............................................. H03K 3/00
[52] U.S. Cl. ................................ 307/296.1; 307/296.6; 307/310
[58] Field of Search .............. 307/272.3, 291.1, 291.6, 307/291.8, 310

[56] References Cited

U.S. PATENT DOCUMENTS 4,540,893 9/1985 Bloomer ...................... 307/296.1 X
4,987,318 1/1991 Burke et al. ................. 307/296.6 X

FOREIGN PATENT DOCUMENTS 0265524 11/1988 Japan ............................. 307/296.1
2222726 3/1990 United Kingdom .

Primary Examiner—Robert J. Pascal
Attorney, Agent, or Firm—Jerry A. Miller

[57] ABSTRACT

A soft start circuit for hot installation of modules into an active bus. A very low $R_{ds}$ MOSFET provides bias through its drain to source path from a bus supply. This path is activated by a gate bias network which charges a capacitor from a supply located on the bus. Further control of the module supply is obtained by circuitry which permits addressing of the module to turn it off or on, temperature sensing to provide thermal protection and current sensing to provide short circuit protection.

10 Claims, 2 Drawing Sheets

1

SOFT START CIRCUIT

BACKGROUND

1. Field of the Invention

This invention relates generally to the field of circuitry used for soft starting of circuit modules. More particularly, this invention relates to a circuit which prevents sudden current spikes and voltage sags on a system bus when modules are plugged into the bus with power connected.

2. Background of the Invention

When modules are plugged into a bus connector while power is active on the bus, several undesirable things happen. Generally, there is an inrush of current to the module being plugged in which can be damaging to components on the module. Also, the supply voltage on the bus sags momentarily due to the sudden inrush of current to the module. This voltage sag can create so called "glitches" in logic circuitry causing logic errors in other circuits attached to the bus or other undesirable responses.

In the past, this problem has usually been addressed by one of three different techniques. The first technique is to place large valued inductors in series with the supply line to limit the amount of current which the module can instantaneously sink. Several problems are associated with this approach. Inductors are physically large and costly. The value required depends on the total capacitance of the module and thus is difficult to standardize for variations in types or variations in modules. Rapid variations in current requirements for the module under normal operation of the module (e.g. due to switching action taking place on the module) can be inhibited by the inductance. On removing a module using inductance as a soft start mechanism, the back EMF may cause large voltage spikes on the module causing damage to module components.

Hot powered rails with current limiting resistors have also been used to begin powering the module prior to full insertion. Unfortunately, this is a costly mechanical solution which cannot be used for all module configurations. Also, different resistance values are required depending upon the amount of capacitance on the modules, further restricting the usefulness of this technique.

So called "umbilical cord" techniques have also been used to provide initial charging of module capacitors prior to insertion. Of course, this technique has potential for human error, is expensive and complicates the module insertion procedure.

The above techniques all rely upon passive components (inductors or resistors) for accomplishing the soft start function. Accordingly they can not be used to turn off the module in a separate function. The present invention addresses the problems associated with these techniques to provide an improved active soft start mechanism which can be further utilized to provide a controlled turn on or turn off of the module under predetermined conditions.

SUMMARY OF THE INVENTION

It is an object of the present invention to provide an improved soft start circuit.

It is a feature that the certain embodiments of the present invention provide short circuit protection.

It is an advantage that embodiments of the present invention can provide for individual addressing of modules to turn power to them on or off.

It is a further advantage that embodiments of the present invention can provide thermal protection to the module.

These and other objects, advantages and features of the invention will become apparent to those skilled in the art upon consideration of the following description of the invention.

In one embodiment of the present invention a soft start circuit provides for hot installation of modules into an active bus. A very low $R_{ds}$ MOSFET provides bias through its drain to source path from a bus supply. This path is activated by a gate bias network which charges a capacitor from a supply located on the bus. Further control of the module supply is obtained by circuitry which permits addressing of the module to turn it off or on, temperature sensing to provide thermal protection and current sensing to provide short circuit protection.

According to one aspect of the present invention, a circuit for providing soft starting current for circuit modules which may be selectively plugged into a bus, the bus including an active power supply connection, includes a very low drain to source resistance field effect transistor having a gate, a drain, a source and a current path from the power supply through the drain and the source for supplying power to the module when the field effect transistor is turned on. A capacitor and a resistor are provided such that responsive to plugging in the module, current is applied through the resistor to charge the capacitor and slowly turn on the field effect transistor to supply power to the module. The power at the module supplied through the field effect transistor is slowly increased to its quiescent level thereby inhibiting voltage sags at the bus and current surges into the module.

According to another aspect of the invention, a circuit for providing soft starting current for circuit modules which may be selectively plugged into a bus, the bus including an active power supply connection includes a very low drain to source resistance field effect transistor having a gate, a drain, a source and a current path from the power supply through the drain and the source for supplying power to the module when the field effect transistor is turned on. A capacitor and a resistor are arranged such that plugging in the module applies current through the resistor to charge the capacitor and slowly turn on the field effect transistor to supply power to the module. The power at the module supplied through the field effect transistor is slowly increased to its quiescent level thereby inhibiting voltage sags at the bus and current surges into the module. A voltage sensor senses voltage drop from the drain to the source of the field effect transistor. A voltage comparator ascertains that the voltage drop exceeds a predetermined voltage threshold. A temperature sensor senses a temperature associated with the module. A temperature comparator ascertains that the temperature is greater than a predetermined temperature threshold. An address memory stores an address code associated with the module. A receiver receives a message directed to the module, the message including a transmitted address, and an on/off bit. An address comparator compares the address code with the transmitted address. A control circuit for turns off the field effect transistor upon ascertaining that the temperature is greater than the predetermined temperature threshold, upon ascertaining that the predetermined voltage threshold has been exceeded by the voltage drop, or upon ascertaining that the address code and the transmitted address match. An inhibiting circuit inhibits operation of the control circuit to turn off the field effect transistor for a predetermined period of time immediately following plugging in the module.

The features of the invention believed to be novel are set forth with particularity in the appended claims. The invention itself however, both as to organization and method of operation, together with further objects and advantages thereof, may be best understood by reference to the following description taken in conjunction with the accompanying drawing.

DETAILED DESCRIPTION OF THE INVENTION

Figure 1:
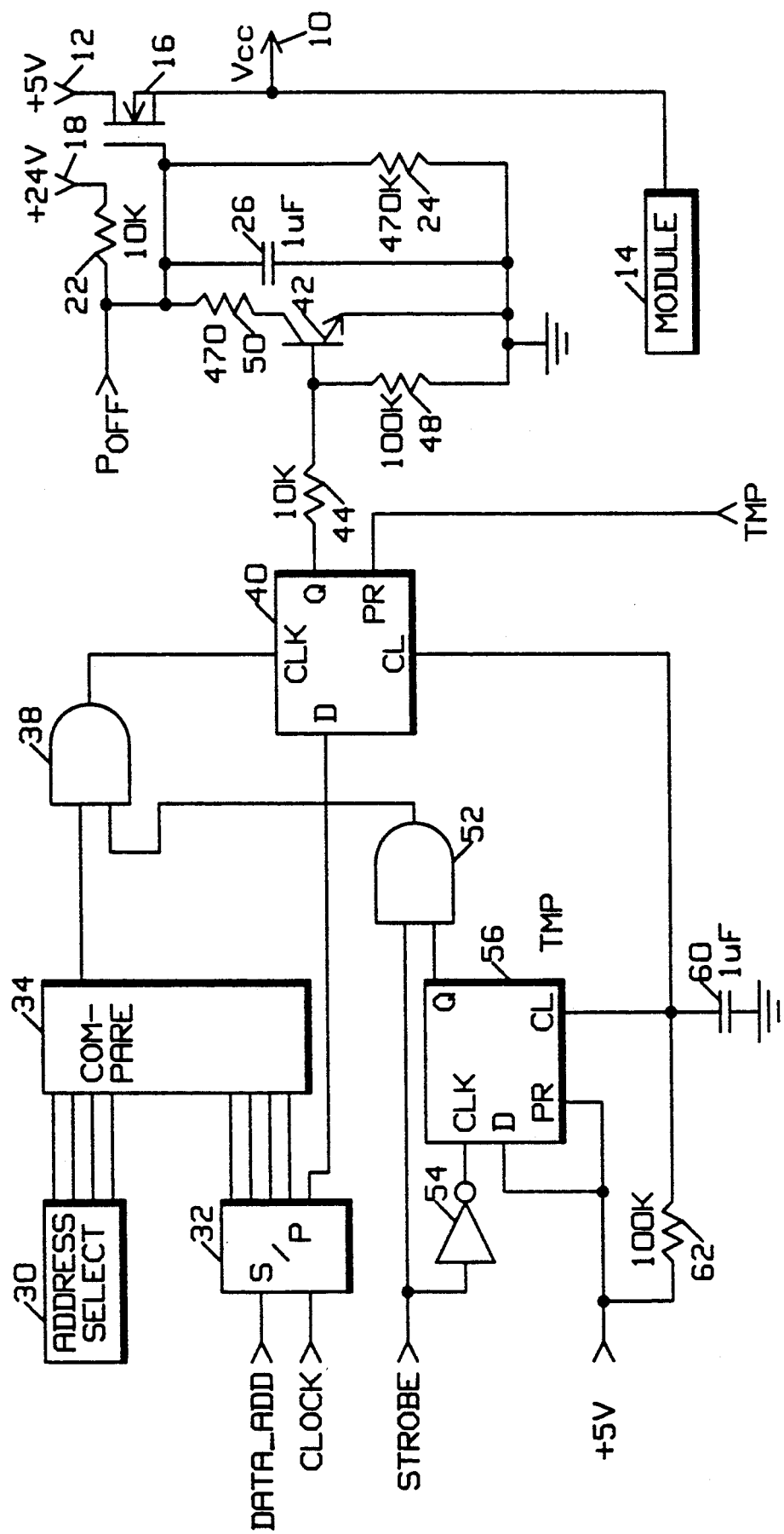
FIG. 1 is a schematic showing the basic soft start circuit of the present invention including module addressing logic.

Turning now to FIG. 1, a soft start circuit according to the present invention is shown including a circuit for externally addressing the module on which the circuit is located. This example circuit provides a soft started voltage 10 referred to as $V_{cc}$ which is derived from a 5 volt bus voltage 12. The voltage $V_{cc}$ is the soft start voltage used to power remaining module circuitry represented in this drawing as module 14. In the preferred embodiment, one or more parts of the circuitry described is duplicated on each such module and is activated when the module is plugged in to a powered bus connector. The voltage $V_{cc}$ is slightly less than the 5 volt bus voltage 12 by virtue of a drain to source voltage drop across a very low $R_{ds}$ n-channel MOSFET 16 such as a model MTP50N06E available from Motorola, Inc. Of course, analogous circuitry can be designed using p-channel field effect transistors.

For purposes of this document, a very low $R_{ds}$ field effect transistor (FET) will be considered to be one which has drain to source resistance, when turned on, which is sufficiently low to produce a negligible voltage drop across the drain to source terminals of the transistors under full load. For example, the above MOSFET 16 has an on resistance of approximately 0.025 ohms. For a total module load of 4 amps through the FET 16, this produces a voltage drop of 0.10 volts which is an insignificant supply voltage degradation for most 5 volt logic circuits. For modules requiring more current, multiple FET's may equivalently be placed in parallel to reduce the voltage drop across the FET's and to provide redundancy.

In the present embodiment, a 24 volt power source 18 is also provided on the bus and is used to provide gate bias through a series of gate resistors 22 and 24 leading to ground. When the module is plugged in, a ground connection, the 5 volt source 12 and the 24 volt source 18 are applied to module connector pins. Plugging in the module, thus, initiates the soft start action of the present circuitry. At plug in, resistor 22 is coupled to 24 volt source 18 and, substantially simultaneously, the drain of transistor 16 is coupled to the 5 volt source 12, while resistor 24 is coupled to ground.

Resistors 22 and 24 are arranged as a voltage divider with the gate bias at their junction. A capacitor 26 is provided in parallel with resistor 24 which begins charging on application of the 24 volt bias voltage. The application of power to the voltage divider gradually turns on the FET 16 over a selected soft start time period as capacitor 26 charges to a level sufficient to fully turn on FET 16. Resistor 24 being much larger than resistor 22, almost the full 24 volt source voltage is applied to the gate and thus turning the FET 16 fully on when capacitor 26 is charged. The soft start time period is determined by the time constants of the capacitor 26 in combination with the resistive load seen by the capacitor 26. In the embodiment of FIG. 1 with the values shown, the resistor 22 and capacitor 26 are the only components having significant contribution to the charging time of capacitor 26. When the module is unplugged, capacitor 26 discharges through resistor 24.

The node connected to the gate of FET 16 is designated $P_{OFF}$. This node may be driven low by other circuitry to selectively turn off the FET 16 to effect control of power to the module. For example, each module may be provided with a four bit address selected by address selection switches 30 (e.g. a dip switch or code plug). A serial version of this four bit address plus an on/off bit is applied to the DATA_ADD terminal and is clocked into a serial to parallel converter 32 (e.g. 74MC164 parallel output serial shift register) by a CLOCK signal. The received address bits are compared with the module address in a comparator 34 (e.g. industry standard 74BC688 comparator) and a logic high output passes through an AND gate 38 to clock FLIP-FLOP 40 if the addresses match. The value of the on/off bit is passed to the D input of FLIP-FLOP 40 to control whether the DATA_ADD signal is directing the module be turned on or off. If the on/off bit is a logic high, the module is to be turned off. If the on/off bit is a logic low, the module is to be turned on.

The output of FLIP-FLOP 40 drives a transistor 42 through base resistor 44. When this FLIP-FLOP output overcomes the bias toward ground on the base provided by resistor 48, it saturates transistor 42. This provides a relatively low resistance path through collector resistor 50 pulling node $P_{OFF}$ low to turn off FET 16. The collector resistor 50 is of relatively low resistance to provide a low impedance discharge path for capacitor 26 through resistor 50 and the saturated transistor 42 to cut off the FET 16 rapidly. When FET 16 is turned off, the drain to source resistance increases to a very high impedance. This effectively shuts off the source of power to the remaining module circuitry 14. Whenever transistor 42 is placed in cutoff, the charging path for the capacitor 26, from the 24 volt supply, is through resistor 22.

The output of the comparator 34 is gated to the FLIP-FLOP 40 by AND gate 38 under the control of a STROBE signal. The STROBE signal is used to establish the end of the message entering on the DATA_ADD line. On a low to high transition of the STROBE signal, the output of the comparator 34 is clocked into FLIP-FLOP 40. Depending upon the output of the comparator, the base of transistor 42 may be toggled to change the state of the module power.

This STROBE signal is further gated by an AND gate 52. A second input to AND gate 52 is controlled by a circuit arrangement used to ignore the first occurrence of a high to low transition of the STROBE signal. This is done due to the uncertain state of the output of comparator 34 at the time of initial plugging in of the module. The uncertain state of this output, and possibly others, can otherwise result in unpredictable switching of transistor 42 at initial plug in. Ignoring this first transition is accomplished by first inverting the STROBE signal at INVERTER 54 and applying this inverted STROBE signal to the Clock input of a D FLIP-FLOP 56. The Q output of FLIP-FLOP 56 is connected to the second input of the AND gate 56. The D and Preset inputs of FLIP-FLOP 56 are tied to the +5 Volt supply. A capacitor 60 is connected to the Clear input of the FLIP-FLOPs 56 and 40 and is charged at the time of plugging in the module through a resistor 62 to slowly charge to a voltage appropriate to toggle the Clear input. Capacitor 60, at plug in time appears to be a short circuit to ground. The voltage across capacitor 60 increases with time until it appears to be an open circuit. The delay in toggling the Clear inputs depends upon the values of capacitor 60, resistor 62 and the load resistance of the Clear inputs of the FLIP-FLOPs 40 and 56 and can be adjusted to produce a suitable delay. These component values are selected to cause the voltage across capacitor 60 to reach the nominal switching point of the FLIP-FLOPS 40 and 56 at after the desired delay.

Figure 2:
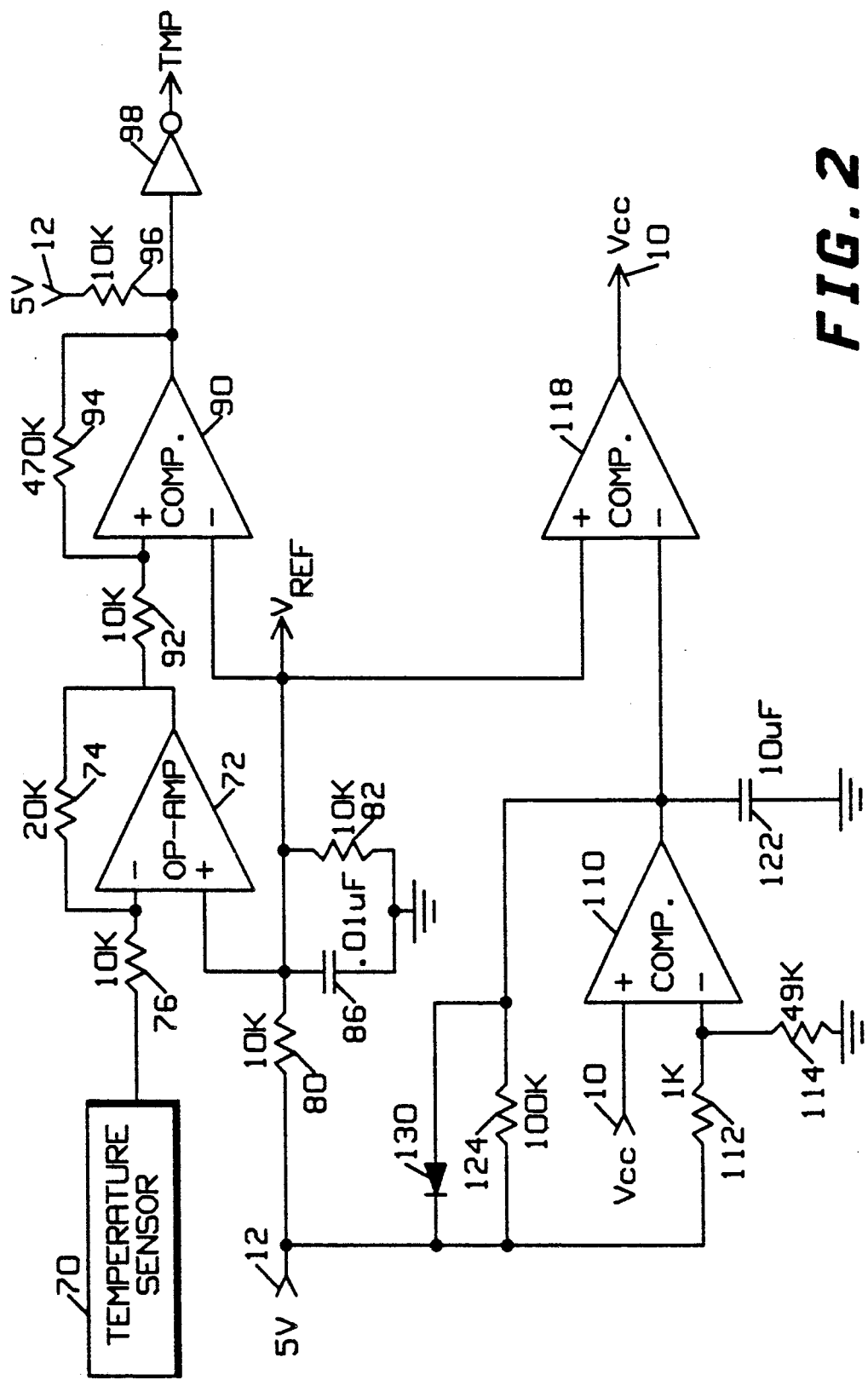
FIG. 2 shows circuitry for temperature sensing used in conjunction with the present soft start circuitry.

The present invention also provides a mechanism for cutting off the module circuitry if the temperature increases beyond an acceptable level. This aspect is shown in FIG. 2. A temperature sensor 70, such as the commercially available LM34, is coupled to an operational amplifier 72. This amplifier 72 is configured as a gain of −2 amplifier using feedback resistor 74 and inverting input resistor 76. Bias to the non-inverting input is provided by a 2.5 volt reference voltage $V_{REF}$ established by series resistors 80 and 82 along with by-pass capacitor 86.

The output of the amplifier 72 is applied to the non-inverting input of a comparator 90 through input resistor 92. Positive feedback resistor 94 establishes hysteresis in the comparator 90. Resistor 96 is a pull-up resistor biasing the open collector output of comparator 90. The inverting input of comparator 90 is referenced to $V_{REF}$. In this example, $V_{REF}$ is set at 2.5 Volts. The temperature sensor produces an output voltage which varies 10 mV per degree Fahrenheit. With the components shown, the comparator will switch states when the temperature exceeds approximately 125 degrees Fahrenheit and includes about 5 degrees of hysteresis to inhibit chattering of the output.

When the comparator 90 changes state, it drives the input of an INVERTER 98 to the opposite state. The output of INVERTER 98 is coupled to the Preset input of FLIP-FLOP 40 of FIG. 1 to produce a logic high output from its Q output. This in turn saturates transistor 42 turning off FET 16.

The present invention can also be used to protect the bus from short circuits occurring on the module circuitry 14. The circuitry to provide this function is also shown in FIG. 2. The voltage across FET 16 (5 volts—$V_{cc}$) is measured by comparing the voltage $V_{cc}$ coupled to the non-inverting input of a comparator 110 (e.g. LM339) with a fraction of the voltage at 5 volt supply 12. Since the inputs of comparator 110 are operating very close to the 5 volt range, comparator 110 derives its supply voltage from the 24 volt source 18.

This is fraction of the 5 volt source 12 is obtained by a voltage divider made up of resistors 112 and 114. In the example of FIG. 2, this divider is designed to produce a voltage level at the inverting input equal to that of the 5 volt supply 12 minus 100 mV. Other current limits can be set by adjusting the resistor values of the voltage divider. Thus, when 100 mV is dropped across the 0.025 ohm on resistance of FET 16, approximately 4 amps is passing through FET 16 indicating a short circuit. When this occurs, the output of comparator 110 changes states causing another comparator 118 to change states. The open collector output of comparator 118 is coupled to $V_{cc}$ 10 driving it low under a short circuit condition to turn off FET 16. Comparator 118 is used primarily to invert the sense of the output of comparator 110. The inverting input of comparator 118 is coupled to the output of comparator 110 while the non-inverting input of comparator 118 is referenced to $V_{ref}$.

When a module is plugged in, a time delay is provided by the capacitor 122 in combination with resistor 124. Capacitor 122 in combination with resistor 124 prevents comparator 118 from changing state until after $V_{cc}$ has stabilized after soft start (since at the time of plug in $V_{cc}$ is zero volts). When the module is unplugged, capacitor 124 discharges through diode 130.

Although not explicitly shown in the figures, the circuitry described receives supply bias from the 5 volt source 12 (except as noted otherwise). Upon plugging in the module, power is immediately available to the circuitry described to effect the soft start and related functions. Since only a small amount of circuitry is used to accomplish these features, only a small current drain is encountered at the time of plugging in the module. This avoids any significant current spikes and voltage sags.

Thus it is apparent that in accordance with the present invention, an apparatus that fully satisfies the objectives, aims and advantages is set forth above. While the invention has been described in conjunction with specific embodiments, it is evident that many alternatives, modifications and variations will become apparent to those skilled in the art in light of the foregoing description. Accordingly, it is intended that the present invention embrace all such alternatives, modifications and variations as fall within the scope of the appended claims.

What is claimed is:

1. A circuit for providing soft starting current for circuit modules which may be selectively plugged into a bus, said bus including an active power supply connection, the circuit comprising in combination:

a very low drain to source resistance field effect transistor having a gate, a drain, a source and a current path from said power supply through said drain and said source for supplying power to said module when said field effect transistor is turned on;

a capacitor;

a resistor; and means, responsive to plugging in said module, for applying current through said resistor to charge said capacitor and slowly turn on said field effect transistor to supply power to said module; whereby, the power at said module supplied through said field effect transistor is slowly increased to its quiescent level thereby inhibiting voltage sags at said bus and current surges into said module.

2. The apparatus of claim 1, further comprising:

voltage sensing means for sensing voltage drop from said drain to said source of said field effect transistor;

voltage comparing means for ascertaining that said voltage drop exceeds a predetermined voltage threshold; and control means for turning off said field effect transistor upon ascertaining that said predetermined voltage threshold has been exceeded by said voltage drop.

3. The apparatus of claim 1, further comprising:

temperature sensing means for sensing a temperature associated with said module;

temperature comparing means for ascertaining that said temperature is greater than a predetermined temperature threshold; and control means for turning off said field effect transistor upon ascertaining that said temperature is greater than said predetermined temperature threshold.

4. The apparatus of claim 1, further comprising:

current sensing means for sensing current through said drain and source of said field effect transistor;

current comparing means for ascertaining that said current exceeds a predetermined current threshold; and control means for turning off said field effect transistor upon ascertaining that said predetermined current threshold has been exceeded by said current through said drain and source.

5. The apparatus of claim 4, further comprising:

inhibiting means for inhibiting operation of said control means to turn off said field effect transistor for a predetermined period of time following plugging in said module.

6. The apparatus of claim 1, further comprising:

address storing means for storing an address code associated with said module;

receiving means for receiving a message directed to said module, said message including a transmitted address, and an on/off bit;

address comparing means for comparing said address code with said transmitted address; and control means for controlling an on/off state of said field effect transistor using said on/off bit in the event said address comparing means determines that said address code and said transmitted address match.

7. The apparatus of claim 6, wherein:

said receiving means receives a serial message and further comprising means for converting said serial message to a parallel signal for comparison with said address code.

8. The apparatus of claim 6, further comprising:

inhibiting means for inhibiting operation of said control means to turn off said field effect transistor for a predetermined period of time immediately following plugging in said module.

9. The apparatus of claim 6, wherein said control means includes latching means for storing said on/off signal.

10. A circuit for providing soft starting current for circuit modules which may be selectively plugged into a bus, said bus including an active power supply connection, the circuit comprising in combination:

a very low drain to source resistance field effect transistor having a gate, a drain, a source and a current path from said power supply through said drain and said source for supplying power to said module when said field effect transistor is turned on;

a capacitor;

a resistor;

means, responsive to plugging in said module, for applying current through said resistor to charge said capacitor and slowly turn on said field effect transistor to supply power to said module; whereby, the power at said module supplied through said field effect transistor is slowly increased to its quiescent level thereby inhibiting voltage sags at said bus and current surges into said module;

voltage sensing means for sensing voltage drop from said drain to said source of said field effect transistor;

voltage comparing means for ascertaining that said voltage drop exceeds a predetermined voltage threshold;

temperature sensing means for sensing a temperature associated with said module;

temperature comparing means for ascertaining that said temperature is greater than a predetermined temperature threshold;

address storing means for storing an address code associated with said module;

receiving means for receiving a message directed to said module, said message including a transmitted address, and an on/off bit;

address comparing means for comparing said address code with said transmitted address;

control means for turning off said field effect transistor upon ascertaining that said temperature is greater than said predetermined temperature threshold, upon ascertaining that said predetermined voltage threshold has been exceeded by said voltage drop, or upon ascertaining that said address code and said transmitted address match; and inhibiting means for inhibiting operation of said control means to turn off said field effect transistor for a predetermined period of time immediately following plugging in said module.

* * * * *